United States Patent
Iwamoto

(10) Patent No.: US 9,607,871 B2
(45) Date of Patent: Mar. 28, 2017

(54) EFEM SYSTEM AND LID OPENING/CLOSING METHOD

(71) Applicant: TDK Corporation, Tokyo (JP)

(72) Inventor: Tadamasa Iwamoto, Tokyo (JP)

(73) Assignee: TDK Corporation, Tokyo (JP)

( * ) Notice: Subject to any disclaimer, the term of this patent is extended or adjusted under 35 U.S.C. 154(b) by 53 days.

(21) Appl. No.: 14/665,308

(22) Filed: Mar. 23, 2015

(65) Prior Publication Data

US 2015/0294888 A1  Oct. 15, 2015

(30) Foreign Application Priority Data

Apr. 14, 2014 (JP) ................. 2014-082422

(51) Int. Cl.
*H01L 21/67* (2006.01)
*H01L 21/677* (2006.01)
*H01L 21/673* (2006.01)

(52) U.S. Cl.
CPC .. *H01L 21/67389* (2013.01); *H01L 21/67017* (2013.01); *H01L 21/67772* (2013.01); *H01L 21/67775* (2013.01)

(58) Field of Classification Search
CPC ................................. H01L 21/67772
See application file for complete search history.

(56) References Cited

U.S. PATENT DOCUMENTS

| | | | | |
|---|---|---|---|---|
| 6,302,927 | B1* | 10/2001 | Tanigawa | H01L 21/67393 29/25.01 |
| 6,817,822 | B2* | 11/2004 | Tokunaga | H01L 21/67772 414/217 |
| 6,996,453 | B2 | 2/2006 | Ahn et al. | |
| 7,726,353 | B2* | 6/2010 | Okabe | H01L 21/67772 141/51 |
| 7,789,609 | B2* | 9/2010 | Okabe | H01L 21/67772 141/51 |
| 8,302,637 | B2* | 11/2012 | Okabe | H01L 21/67772 141/63 |
| 8,978,718 | B2* | 3/2015 | Emoto | H01L 21/67017 141/51 |
| 9,010,384 | B2* | 4/2015 | Yoshimura | H01L 21/67772 141/63 |
| 9,153,468 | B2* | 10/2015 | Emoto | H01L 21/67772 |
| 2009/0169342 | A1* | 7/2009 | Yoshimura | H01L 21/67772 414/217 |
| 2014/0157722 | A1* | 6/2014 | Iwamoto | H01L 21/67775 53/111 R |
| 2015/0024671 | A1* | 1/2015 | Taniyama | F24F 9/00 454/193 |

FOREIGN PATENT DOCUMENTS

JP 2004-311940 11/2004
JP 2007-227619 9/2007

* cited by examiner

*Primary Examiner* — James Keenan
(74) *Attorney, Agent, or Firm* — Oblon, McClelland, Maier & Neustadt, L.L.P.

(57) ABSTRACT

An object is to prevent down flow gas from entering into a pod in an open state in an EFEM system. An upper canopy is provided along the upper edge of an opening portion on the mini-environment side to block down flow along the opening portion. The upper canopy provides a space in which inert gas supplied through a supply port provided in the pod flows into the mini-environment through the opening of the pod after circulating inside the pod. The down flow has no effect in this space, and the entrance of down flow into the pod can be prevented.

6 Claims, 4 Drawing Sheets

EFEM SYSTEM AND LID OPENING/CLOSING METHOD

BACKGROUND OF THE INVENTION

Field of the Invention

The present invention relates to what is called an EFEM (Equipment front end module) system used to transfer wafers held in a closed transportation container called a pod to a semiconductor processing apparatus in semiconductor manufacturing process or the like and to a lid opening/closing system using such an EFEM system.

Description of the Related Art

In semiconductor manufacturing processes in recent years, there have been widely used a method of keeping a highly clean condition only in the interior of three spaces including the interior of processing apparatuses, the interior of pods in which wafers are stored to allow transfer of the wafers between processing apparatuses, and a mini-environment (or small space) through which the wafers are transferred between a pod and each processing apparatus, thereby controlling the cleanliness throughout the process. The pod as such is a container composed of a body in which wafers are stored and that has an opening provided on one side thereof through which wafers are brought into/out of it, and a lid for closing the opening to seal the interior space of the pod. The mini-environment has an opening portion that can be opposed to the opening of the pod and a second opening portion provided on the semiconductor processing apparatus side opposite to the opening portion.

The mini-environment is supplied with clean air, which is ambient air cleaned using a filter. An apparatus used to open and close the lid of the aforementioned pod, the mini-environment, and a wafer transfer system provided in the mini-environment are collectively called an EFEM system. In the EFEM system, the cleanness of the mini-environment is kept to a predetermined level by the use of clean air supplied through the filter. With miniaturization and improvement in the performance of semiconductor devices in recent years, wiring patterns used in semiconductor devices have become finer, and it is required more strictly to prevent the patterns from being affected by oxidation.

To meet this requirement, Japanese Patent Application Laid-Open No. 2004-311940 discloses a technique in which contaminants are removed from clean gas introduced into a substrate transfer chamber constituting the aforementioned mini-environment, and the clean gas is used in a circulative manner. On the other hand, there is another attempt in which the amount of particles and oxygen concentration in the pod are reduced by what is called bottom purge introducing clean gas directly from the bottom of the pod, as disclosed in Japanese Patent Application Laid-Open No. 2007-227619.

Air (atmospheric air) cleaned using a fan filter unit (FFU) is introduced into the aforementioned mini-environment. The clean air has an oxygen concentration and a humidity higher than those of inert gas directly supplied into the pod by bottom purge in typical cases. In the case where the aforementioned supply of inert gas by bottom purge and the supply of clean gas into the mini-environment are performed at the same time, there is a possibility that the clean gas supplied into the mini-environment may enter the pod or container to be mixed with the inert gas supplied by bottom purge. Since the volume of the mini-environment is much larger than the volume of the container, even if the oxygen concentration of the clean gas introduced into the mini-environment is controlled, the oxygen concentration of the clean gas is higher than that of the inert gas introduced into the container. In consequence, the entrance of the clean gas in the mini-environment into the container may prevent satisfactory reduction of oxygen concentration inside the container by the supply of inert gas, and oxidation of the wafer surface cannot be prevented sufficiently, in some cases.

SUMMARY OF THE INVENTION

The present invention has been made in view of the above-described circumstances, and its object is to provide an EFEM system that can reduce the possibility of the entrance of atmosphere in the mini-environment into the container when bottom purge and cleaning of the mini-environment are performed at the same time and to provide a method of opening/closing the lid of a pod with such an EFEM system.

To achieve the above object, according to the present invention, there is provided an EFEM system comprising:

a lid opening/closing system that detaches a lid from a container, which has a substantially box-like body having an opening on one side in which contents can be housed, the lid that closes said opening to form a closed space in cooperation with said body and can be detached from said body, and a supply port provided on a wall of said body to enable supply of gas from outside, thereby opening said opening to allow transfer of said contents into/out of the container;

a mount base on which said container is placed;

a mini-environment arranged adjacent to said mount base and having a down flow generator for generating down flow of gas flowing from above to below, in which a transferring unit for transferring said contents to a processing chamber in which said contents are to be processed is provided;

an opening portion having a substantially rectangular shape provided in a wall arranged adjacent to said mount base and partly defining said mini-environment, said opening portion being located in such a way as to allow said opening of said container placed on said mount base to directly face said opening portion;

a door that can hold said lid, close said opening portion, and open said opening portion while holding said lid to bring said opening and said opening portion into communication;

a supply valve cooperating with said supply port to supply gas into said container;

a gas supply system that supplies gas through said supply port and said supply valve into said container placed on said mount base; and an upper canopy fixed to the wall and provided along an upper edge of said opening portion on said mini-environment side.

It is preferred that the above-described EFEM system further comprise a side canopy provided along a side edge of said opening portion on said mini-environment side. It is preferred that the side canopy be fixedly provided on a side edge of said opening portion. Moreover, it is preferred that an end of said side canopy is in contact with said upper canopy. It is also preferred that the length of the side canopy along the side edge of said opening portion be equal to or longer than one-third of the length of said opening portion along said side edge. It is also preferred that the length of the upper canopy along the direction in which it projects into said mini-environment be larger than the length of said side canopy in the direction in which it projects into said mini-environment.

To achieve the above-described object, according to the present invention, there is also provided a lid opening/closing method for detaching a lid of a container, which has a substantially box-like body having an opening on one side in which contents can be housed, the lid that closes said opening to form a closed space in cooperation with said body and can be detached from said body, and a supply port provided on a wall of said body to enable supply of gas from outside, thereby opening said opening to allow transfer of said contents into/out of the container, comprising the steps of:

placing said container on a mount base;

creating down flow of gas flowing from above to below in a mini-environment arranged adjacent to said mount base, in which a transfer unit for transferring said contents to a processing chamber in which said contents are to be processed is provided;

detaching said lid from said container by a door that closes an opening portion having a substantially rectangular shape provided in a wall adjacent to said mount base and partly defining said mini-environment, thereby bring said opening and said opening portion in communication; and supplying gas into said container through said supply port, wherein the down flow along the opening portion is blocked by an upper canopy fixed to the wall and provided along an upper edge of said opening portion on said mini-environment side to provide a space in which said gas supplied through said supply port flows into said mini-environment through said opening.

In the system and method according to the present invention, when the door is open, downward flow of gas supplied by the down flow generator in the mini-environment is partly blocked by the upper canopy. Thus, entrance of the gas into the container through the opening portion can be prevented.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 1:
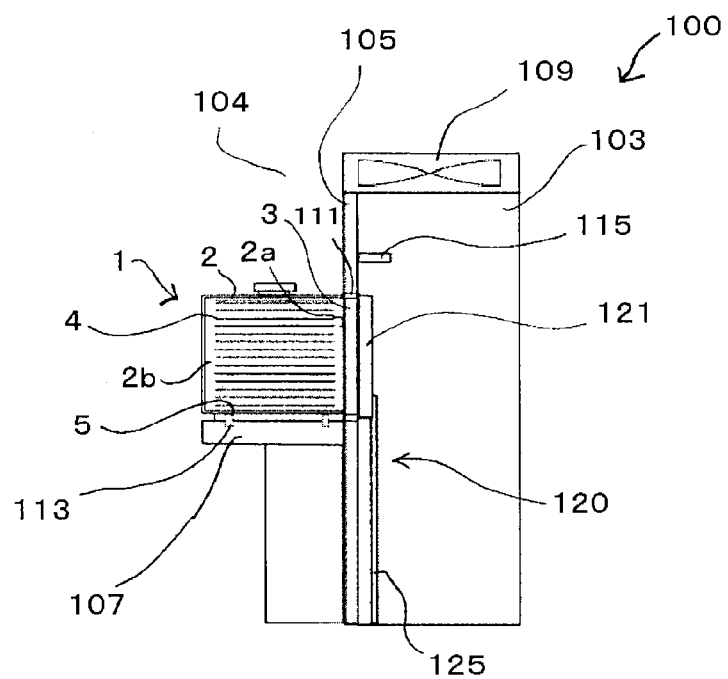
FIG. 1 is a side view schematically showing an EFEM system according to a first embodiment of the present invention, where a pod is placed on a load port apparatus.
Figure 2:
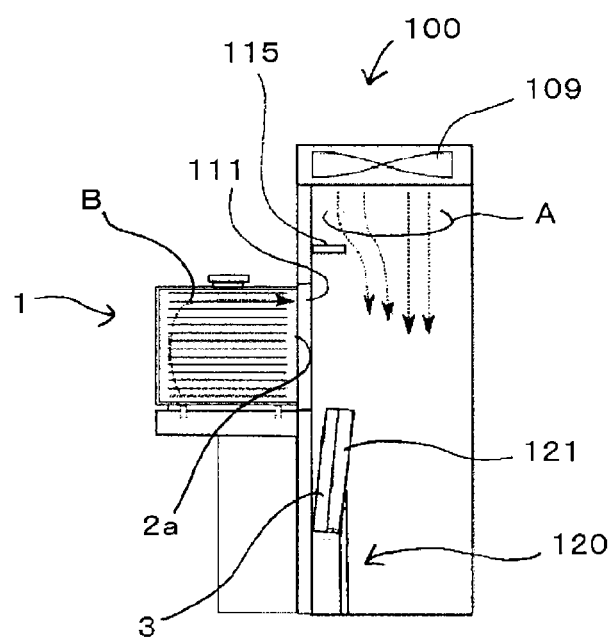
FIG. 2 is diagram schematically showing how gas flows in the EFEM system shown in FIG. 1 when down flow is generated and purging of the pod is performed.
Figure 3:
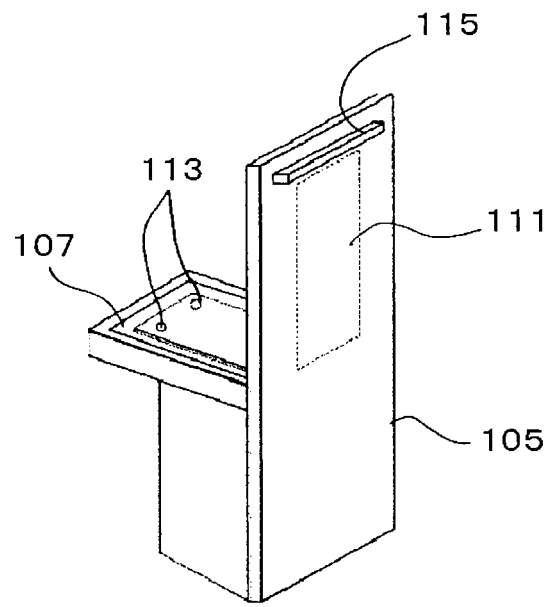
FIG. 3 is a perspective view of the load port apparatus according to the first embodiment.

FIG. 1 is shows the general construction of a load port apparatus 100 constituting an EFEM system according to an embodiment of the present invention as seen from side. A pod 1 is placed on a mount base of the load port 100. FIG. 2 schematically shows how gas flows in the apparatus shown in FIG. 1 when gas is actually supplied to it. FIG. 3 is a perspective view of the load port apparatus 100, where the pod and door components shown in FIG. 1 are not illustrated.

Prior to the description of this embodiment, the pod (airtight container) in which wafers are housed as contents will be described first. The pod 1 shown in FIGS. 1 and 2 is composed of a pod body 2 and a lid 3. The pod body 2 has an interior housing space 2b in which wafers 4 or the like are housed and an opening 2a provided on one side, which leads the housing space 2b. The opening 2a is closed by the lid 3. The pod body 2 also has a plurality of racks (not shown) projecting from its side walls into the housing space 2b. A plurality of wafers 4 are horizontally held by the racks in the housing space 2b at regular spaces. The pod body 2 is provided with a pod nozzle 5 provided on the bottom. The pod nozzle 5 enables supply of gas into the housing space from the outside and discharge of gas to the outside. The pod nozzle 5 is provided on the bottom of the pod body 2 to cooperate with a gas supply system on the mount base, which will be describer later. Alternatively, the pod nozzle 5 may be provided on another inner wall of the pod body 2 such as a side wall.

In this embodiment, for the sake of explanation, the X axis is taken along the direction of driving of the pod body 2 described later, the Y axis is taken in the direction perpendicular to the X axis and defines the planes of wafers together with the X axis (the Y axis being perpendicular to the plane of the drawing sheet of FIG. 1), and the Z axis is taken along the direction perpendicular to the X-Y plane defined by the X and Y axes. In this embodiment, the Z axis runs vertically, and "upward" and "downward" in this specification mean "vertically upward" and "vertically downward" respectively. Nevertheless, the direction of the Z axis in this embodiment is not limited to the vertical direction, but it may be inclined from the vertical direction if necessary.

The load port apparatus is the main component of the EFEM system in this embodiment. This load port apparatus 100 will be described specifically in the following. The load port apparatus 100 provides a mini-environment 103 separated from the external space 104 by a side plate 105. The load port apparatus 100 has a mount base 107 for the pod provided adjacent to the side plate 105. The side plate 105 has an opening portion 111 through which the mini-environment 103 and the external space 104 can be in communication with each other. A down flow generator 109 is provided on top of the mini-environment 103 defined by the side wall 105 and other parts.

The down flow generator 109 takes air in the external space 104 into the mini-environment 103 after cleaning it. In consequence, down flow or gas flow flowing from the top to the bottom of the mini-environment 103 is created therein. The down flow generator has a fan and a filter for removing contaminants such as dust from the gas introduced from the external space 104, in accordance with the degree of cleanness of the external space 104. A structure that allows the down flow gas to exit out of the mini-environment 103 is provided at the bottom of the mini-environment 103. Dust or the like generated in the mini-environment 103 is brought by the down flow and discharged to the external space 104 through the bottom of the mini-environment 103.

The load port has a door system 120 including a door 121, which substantially closes the opening portion 111. The door system 120 includes the door 121, a door arm 125, and a door driving mechanism, which is not shown in the drawings. The door 121 is adapted to be capable of holding the lid 3. The door 121 is also adapted to be capable of fixing the lid 3 to the pod body 2 and detaching the lid 3 from the pod body 2. The door drive mechanism supports the door 121 by the door arm 125 and swings the door arm 125 about the pivot at the location of connection with the door arm 125 to thereby shifting the door 121 toward and away from the pod 1. The door drive mechanism has a Z-axis drive mechanism, which can move the door 121 and the door arm 125 downwardly along the Z axis. As the Z-axis drive mechanism moves the door 121 downward, the opening portion 111 is opened.

The mount base 107 on which the pod 1 is placed can fix the pod 1 placed thereon and move the pod 1 toward and away from the opening portion 111 (more specifically, the door 121 closing the opening portion 111). The mount base 107 is provided with a table drive mechanism (not shown), which moves the pod 1 to a position at which the pod 1 is spaced apart from the door 121 by a predetermined distance or in contact with the door 121. After the driving of the pod 1 is stopped, the door 121 holds the lid 3. In this state, the door 121 detaches the lid 3 from the pod body 2 as described above, and the door 121 is moved downward by the door drive mechanism away from the opening portion 111 to open the opening 2a of the pod 1 to the mini-environment 103.

The mount base 107 is provided with a mount base nozzle 113 on its top surface at a position aligned with the aforementioned pod nozzle 5. The mount base nozzle 113 is connected with a gas supply channel (not shown) and cooperates with the pod nozzle 5 to allow supply of gas from the gas supply channel into the pod 1. The mount base nozzle 113 and the pod nozzle 5 constitute the bottom purge unit according to the present invention. The humidity and purity (oxygen content) of the gas (which is dry nitrogen, in this embodiment) supplied to the gas supply channel is controlled beforehand. It is preferred that the temperature of the gas supplied into the pod 1 be also controlled by a temperature control device or other means. Moreover, it is preferred that dust in the gas be controlled by a specific filter provided in the mount base nozzle 113 or/and the pod nozzle 5. The oxygen concentration and the humidity of the inert gas supplied to the housing space 2b inside the pod 2 by these nozzles are lower than the oxygen concentration and the humidity of the air supplied into the mini-environment 103 by the down flow generator 109 respectively.

How clean gas is actually supplied into the mini-environment 103 by the down flow generator 109 and how inert gas is supplied through the pod nozzle 5 in the EFEM system having the above-described configuration will now be described. FIG. 2 schematically shows how gas flows in the EFEM system shown in FIG. 1 in the above-described state. In this state, the lid 3 of the pod has been detached by the door 121, and the pod opening 2a is open to the mini-environment 103. Down flow is indicated by arrows A, and the flow of inert gas, which is supplied into the housing space 2b inside the pod through the pod nozzle 5, from inside the pod 2 to the mini-environment 103 is indicated by arrow B.

In the EFEM system of this embodiment, an upper canopy 115 extending along the upper edge of the opening portion 111 is fixedly provided on the side plate 105 on the mini-environment 103 side. The upper canopy 115 is projected from the side plate 105 as a projection. The down flow A flowing from above to below in the mini-environment 103 is created in substantially the entire area in the plan view of the mini-environment 103. The upper canopy 115 partly blocks the path of the down flow A, thereby creating a space free from the down flow A in front of the opening portion 111 on the mini-environment side 103. In the present invention, creating a region just in front of the opening portion 111 in which down flow is eliminated by partly blocking the down flow along the opening portion 111 is expressed by the expression "the down flow along the opening portion 111 is blocked". In conventional systems, the down flow A exists also in the region very close to the opening portion 111. In the state in which the lid 3 is detached and the opening 2a is left open, gas in the down flow A partly enters the housing space 2b to increase the oxygen concentration in the housing space 2b. In this embodiment, the down flow A is kept away from the opening portion 111. Thus, the entrance of gas into the housing space 2b through the opening portion 111 can be prevented.

In this embodiment, what is called bottom purge is performed at the same time, namely inert gas is supplied from the pod nozzle 5 into the housing space 2b. The inert gas supplied from the bottom of the pod 2 forms a gas flow schematically represented by arrow B, enabling replacement of the gas existing in the pod 2 with the supplied gas having higher purity. Actually, there also are inert gas flows that pass through the gaps between the wafers 4 to the opening 2a, though only the largest flow is indicated by arrow B in FIG. 2. Without the upper canopy 115, the gas flow B passing through the opening portion 111 would encounter the down flow A just immediately in front of the opening portion 111. Then, turbulence would occur in the vicinity of the opening portion 111, and the down flow A having high flow rate would create an eddy toward the housing space 2b. The upper canopy 115 shifts the turbulence and eddy to locations below the upper canopy 115 on the mini-environment 103 side of the opening portion 111. Consequently, the entrance of gas into the housing space 2b by the down flow can be reduced greatly.

It is preferred that supply of inert gas into the housing space 2b by the bottom purge unit be started in accordance with the timing of opening of the lid 3 of the pod by the door 121. With the above-described features, it is possible to reduce or prevent an increase in the oxygen concentration or humidity in the housing space due to the entrance of gas into the housing space by the down flow. Thus, the wafers can be stored in a space in which desired oxygen concentration and humidity are kept. FIG. 3 is a perspective view of the load port apparatus 100 seen from the mini-environment 103 side. As shown in FIG. 3, it is preferred that the length of the upper canopy 115 be larger than the horizontal length of the opening portion 111 to extend beyond the opening portion 111 by equal lengths on both sides. It is also preferred that the length of the upper canopy be set taking into consideration the flow speed of the down flow A and the flow speed of inert gas supplied to the housing space 2b or at least the flow speed of the inert gas flow B flowing along the upper surface of the pod so that turbulence and eddy generated by them are spaced apart from the opening portion 111 by a predetermined distance. Similarly, the distance between the upper canopy 115 and the upper edge of the opening portion 111 be set appropriately taking into consideration the down flow A and the flow B.

Figure 4:
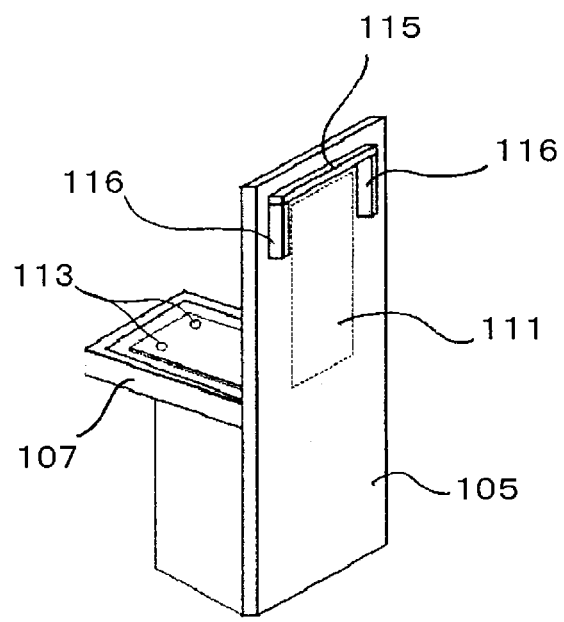
FIG. 4 is a perspective view of the load port apparatus according to a second embodiment.

Next, a second embodiment of the present invention will be described with reference to FIG. 4. FIG. 4 shows the system according to the second embodiment in the same manner as FIG. 3. Components the same as those in the above-described first embodiment are denoted by the same reference numerals and will not be described further. In this embodiment, side canopies 116 extending along the side edges of the opening portion 111 are provided in addition to the upper canopy 115. The side canopies 116 extend along and parallel to the side edges of the opening portions 111. The side canopies 116 project from the side plate 105 on the mini-environment 103 side. The side canopy 116 is a rectangular plate having a specific length and a specific width. The width of the side canopy 116 at its upper end may be different from that at the lower end. Moreover, the side canopy 116 may be fixed in such a way that it is located close to the side edge of the opening portion 111 so that it is coplanar with the inner surface of the side edge, and the lower portion of the side canopy 116 is spaced apart from the opening portion 111 by a certain distance.

The above-described arrangement of the side canopies 116 can prevent gas from being caused by the down flow A to enter the housing space 2b across the sides of the opening portion 111. It is preferred that the side canopies 116 be fixed on the side edges of the opening portion 111, as shown in FIG. 4. With this arrangement, the canopies extend partly around the opening portion 111, so that the gas supplied through the down flow generator 109 is prevented from entering the opening portion 111 from its sides. It is preferred that the side canopies 116 be in contact with the upper canopy 115 at their ends, as shown in FIG. 4. Thus, the upper canopy 115 and the side canopies 116 continuously extend in a rectangular U shape, effectively preventing gas from entering the opening portion from its sides at the upper portion of the opening, where detrimental effects of the lateral entrance of the gas supplied through the down flow generator 109 tend to be large.

Figure 5:
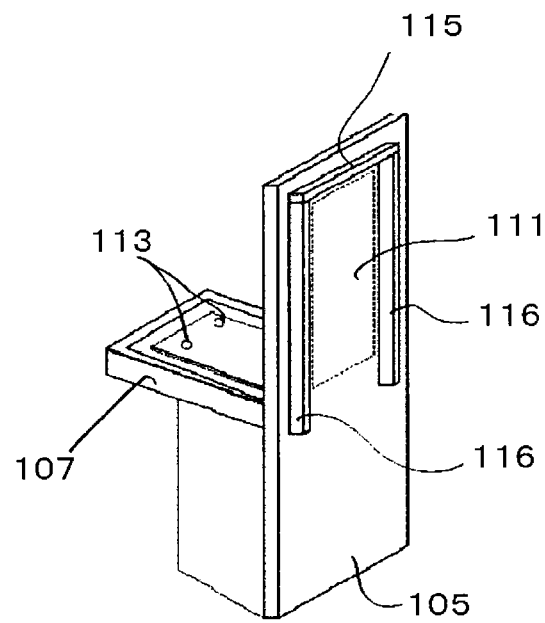
FIG. 5 is a perspective view of the load port apparatus according to a third embodiment.

It is preferred that the length of the side canopies 116 along the Z direction be large. FIG. 5 shows a third embodiment, in which the side canopies 116 have a preferred length. As described above, the side canopies 116 prevent or reduce the entrance of gas from the sides of the opening portion 111. Therefore, it is preferred that the side canopies 116 extend all along the opening region of the opening portion 111. However, it is preferred that the side canopies 116 do not extend in the region in which they can interfere with the operation of a robot arm (not shown), which enters into the pod 2 through the opening portion 111 to transfer the wafers 4 from/into the pod. The flow rate of the down flow decreases toward the lower end of the opening portion 111, and the probability of the occurrence of turbulence also decreases accordingly. Therefore, while sufficiently long side canopies 116 can prevent the lateral entrance of gas more effectively, the length of the canopies may be limited to approximately one-third of the length of the opening portion 111 along the Z direction to prevent the aforementioned interference.

Figures 6A, 6B:
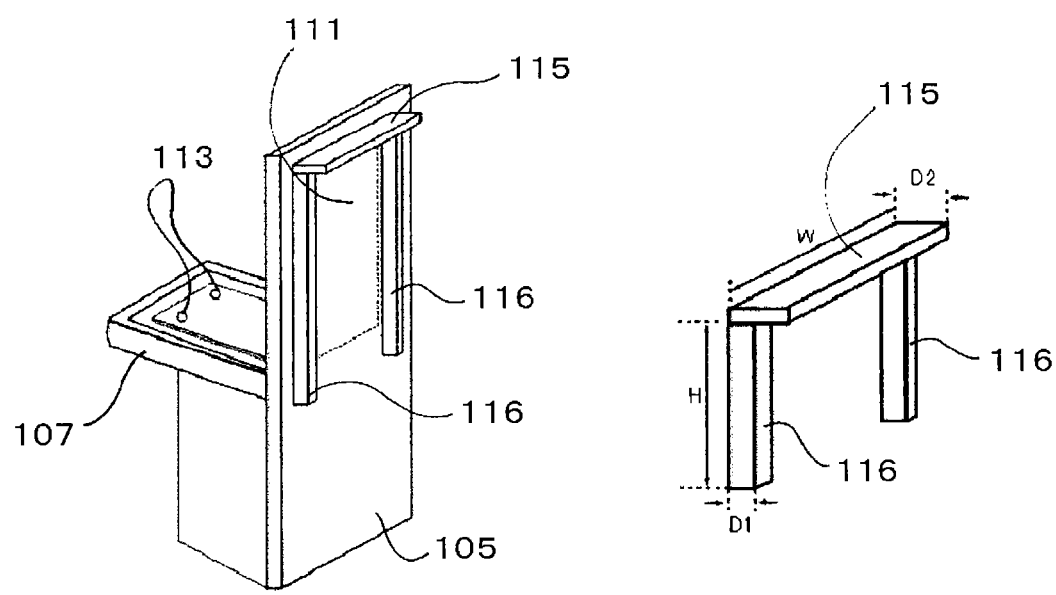
FIG. 6A is a perspective view of the load port apparatus according to a fourth embodiment.
FIG. 6B illustrates dimensions of canopies.

When bottom purge is performed while the down flow is created, the region in which turbulence is most likely to occur is the region along the upper edge of the opening portion 111. Therefore, only the upper canopy 115 may be made large, and the side canopies 116 may be reduced to a minimum size that can exercise its function to prevent the aforementioned interference with the robot arm. FIGS. 6A and 6B show a fourth embodiment as such. FIG. 6A is a perspective view of the system of the fourth embodiment, and FIG. 6B is a partial view illustrating the dimensions of the canopies. As shown in these drawings, the upper canopy 115 has length W along the width direction of the opening portion 111 (i.e. Y direction) and length D2 along the direction of its projection into the mini-environment (i.e. X direction). The side canopy 116 has a length H along the vertical direction of the opening portion 111 (i.e. Z direction) and length D1 along the direction of its projection into the mini-environment (i.e. X direction). In this embodiment, length D2 is set larger than length D1 for the above-described reason.

Figure 7:
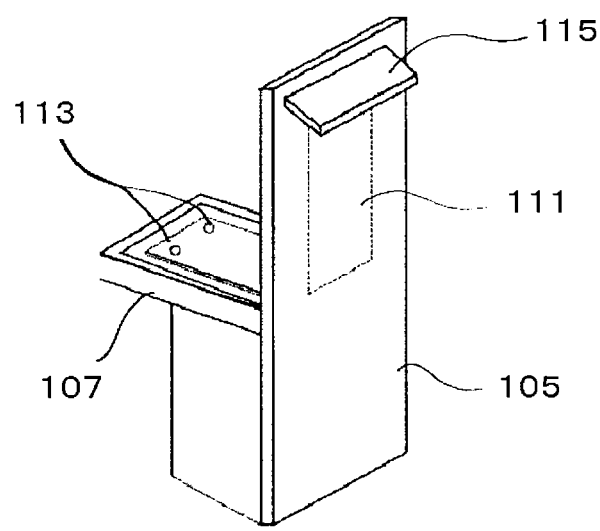
FIG. 7 is a perspective view of the load port apparatus according to a fifth embodiment.

In this embodiment, the upper canopy 115 is fixed on the side plate 105 in a state in which it is perpendicular to the side plate 105 and parallel to the inner surface of the upper edge of the opening portion 111. In a fifth embodiment shown in FIG. 7, the upper canopy 115 attached to the side plate 105 extends obliquely therefrom so that it lowers as it extends away from the side plate 105. If the upper canopy 115 extends perpendicularly to the side plate 105, as is the case with the above-described other embodiments, the down flow strikes on the upper canopy 115 perpendicularly. Consequently, the down flow is disturbed on the upper canopy 115. The higher the flow speed of the down flow is, the stronger and wider the effect of turbulence thus occurring is. Providing the upper canopy that extends obliquely as described above reduces disturbance of gas flow and allows the down flow to be maintained with small disturbance in the entire region in the mini-environment 103.

As described in the foregoing, in the system according to the present invention, the entrance of gas into the opening portion from its sides can be prevented or reduced. Moreover, since the canopies partly surround the opening portion even in the state in which door is open, the flow of gas supplied through the down flow generator is always prevented from being deflected to enter the opening portion. In the case where the upper canopy and the side canopies are arranged in a rectangular U shape, gas is prevented from entering the opening portion from its sides at the upper portion of the opening, where detrimental effects of the lateral entrance of the gas supplied through the down flow generator 109 tend to be large. In the case where sufficiently long side canopies are provided, the entrance of gas into the opening portion from its side can be prevented more effectively. In the case where the upper canopy is long relative to the side canopies, the entrance of the gas supplied through the down flow generator into the opening portion from its sides can be effectively reduced. Moreover, relatively short side canopies can prevent the entrance of the gas into the opening portion from its sides while preventing interference with the operation of the robot arm when contents of the container are transferred from the container to the mini-environment.

As described in the foregoing, the present invention relates to an EFEM system suitable for use with semiconductor processing apparatuses. However, the applicability of the present invention is not limited to use with such processing apparatuses, but the present invention can also be applied to EFEM system used with various processing apparatuses that perform processing similar to semiconductor processing, such as processing apparatuses for liquid crystal display panel.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-082422, filed Apr. 14, 2014 which is hereby incorporated by reference herein in its entirety.

What is claimed is:

1. An EFEM system comprising:

a lid opening/closing system that detaches a lid from a container, which has a substantially box-like body having an opening on one side in which contents can be housed, the lid that closes said opening to form a closed space in cooperation with said body and can be detached from said body, and a supply port provided on a wall of said body to enable supply of gas from outside, the lid opening/closing system opening said opening to allow transfer of said contents into/out of the container;

a mount base on which said container is placed;

a mini-environment arranged adjacent to said mount base and having a down flow generator for generating down flow of gas flowing from above to below the mini-environment, in which a transferring unit for transferring said contents to a processing chamber in which said contents are to be processed is provided;

an opening portion having a substantially rectangular shape provided in a wall arranged adjacent to said mount base and partly defining said mini-environment, said opening portion being located in such a way as to allow said opening of said container placed on said mount base to directly face said opening portion;

a door that can hold said lid, close said opening portion, and open said opening portion while holding said lid to bring said opening and said opening portion into communication;

a supply valve cooperating with said supply port to supply gas into said container;

a gas supply system that supplies gas through said supply port and said supply valve into said container placed on said mount base;

an upper canopy fixed to the wall and provided along an upper edge of said opening portion on said mini-environment side; and a side canopy fixedly provided along a side edge of said opening portion on said mini-environment side, on the side edge of said opening portion.

2. An EFEM system according to claim 1, wherein an end of said side canopy is in contact with said upper canopy.

3. An EFEM system according to claim 1, wherein the length of said side canopy along the side edge of said opening portion is limited to one-third of the length of said opening portion along said side edge.

4. An EFEM system according to claim 1, the length of said upper canopy along the direction in which it projects into said mini-environment is larger than the length of said side canopy in the direction in which it projects into said mini-environment.

5. A lid opening/closing method for detaching a lid of a container, which has a substantially box-like body having an opening on one side in which contents can be housed, the lid that closes said opening to form a closed space in cooperation with said body and can be detached from said body, and a supply port provided on a wall of said body to enable supply of gas from outside, said opening being opened to allow transfer of said contents into/out of the container, the method comprising:

placing said container on a mount base;

creating down flow of gas flowing from above to below in a mini-environment arranged adjacent to said mount base, in which a transfer unit for transferring said contents to a processing chamber in which said contents are to be processed is provided;

detaching said lid from said container by a door that closes an opening portion having a substantially rectangular shape provided in a wall adjacent to said mount base and partly defining said mini-environment, thereby bring said opening and said opening portion in communication; and supplying gas into said container through said supply port, wherein the down flow along the opening portion is blocked by (a) an upper canopy fixed to the wall and provided along an upper edge of said opening portion on said mini-environment side and (b) a side canopy fixedly provided along a side edge of said opening portion on said mini-environment side, on the side edge of said opening portion, to provide a space in which said gas supplied through said supply port flows into said mini-environment through said opening.

6. A system comprising:

a container including:

a lid;

a substantially box-like body having an opening on one side in which contents can be housed, the lid that closes said opening to form a closed space in cooperation with said body and can be detached from said body; and a supply port provided on a wall of said body to enable supply of gas from outside, and an EFEM system including:

a lid opening/closing system opening said opening to allow transfer of said contents into/out of the container;

a mount base on which said container is placed;

a mini-environment arranged adjacent to said mount base and having a down flow generator for generating down flow of gas flowing from above to below the mini-environment, in which a transferring unit for transferring said contents to a processing chamber in which said contents are to be processed is provided;

an opening portion having a substantially rectangular shape provided in a wall arranged adjacent to said mount base and partly defining said mini-environment, said opening portion being located in such a way as to allow said opening of said container placed on said mount base to directly face said opening portion;

a door that can hold said lid, close said opening portion, and open said opening portion while holding said lid to bring said opening and said opening portion into communication;

a supply valve cooperating with said supply port to supply gas into said container;

a gas supply system that supplies gas through said supply port and said supply valve into said container placed on said mount base;

an upper canopy fixed to the wall and provided along an upper edge of said opening portion on said mini-environment side; and a side canopy fixedly provided along a side edge of said opening portion on said mini-environment side, on the side edge of said opening portion.

* * * * *